(12) United States Patent
Cork et al.

(10) Patent No.: US 8,421,461 B2
(45) Date of Patent: Apr. 16, 2013

(54) UPCONVERTER

(75) Inventors: Peter Cork, Romsey (GB); Anthony Peter Hulbert, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 427 days.

(21) Appl. No.: 12/753,159

(22) Filed: Apr. 2, 2010

(65) Prior Publication Data

US 2010/0253353 A1    Oct. 7, 2010

(30) Foreign Application Priority Data

Apr. 3, 2009  (GB) .................................. 0905754.8
Sep. 8, 2009  (GB) .................................. 0915656.3
Oct. 27, 2009 (GB) .................................. 0918763.4

(51) Int. Cl.
*G01V 3/00*    (2006.01)
*G01R 33/20*   (2006.01)

(52) U.S. Cl.
USPC ............ 324/316; 324/318; 324/322; 330/165

(58) Field of Classification Search ........... 324/300–322
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 4,387,470 A | 6/1983 | Maurer et al. | |
| 5,245,288 A | 9/1993 | Leussler | |
| 5,384,536 A | 1/1995 | Murakami et al. | |
| 6,906,520 B2 | 6/2005 | Heid et al. | |
| 7,123,009 B1 | 10/2006 | Scott | |
| 7,123,090 B2 | 10/2006 | Ratzel | |
| 7,323,876 B2 | 1/2008 | Den Boef | |
| 7,417,433 B2 | 8/2008 | Heid et al. | |
| 7,622,928 B2 | 11/2009 | Gauss et al. | |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,777,492 B2 | 8/2010 | Vernickel et al. | |
| 2003/0206019 A1 | 11/2003 | Boskamp | |
| 2005/0020205 A1* | 1/2005 | Khoini-Poorfard | ............. 455/23 |
| 2007/0013376 A1 | 1/2007 | Heid et al. | |

(Continued)

FOREIGN PATENT DOCUMENTS

DE    103 04 861 A1    8/2004
GB    1132545           1/1967

OTHER PUBLICATIONS

U.S. Appl. No. 12/874,706, filed Sep. 2, 2010.
U.S. Appl. No. 12/726,567, filed Mar. 18, 2010.
U.S. Appl. No. 12/753,132, filed Apr. 2, 2010.

(Continued)

*Primary Examiner* — Vincent Q Nguyen
*Assistant Examiner* — Emily Chan
(74) *Attorney, Agent, or Firm* — Schiff Hardin LLP

(57) ABSTRACT

A magnetic resonance imaging system upconverter stage has a number of local coils and a number of upconverters to receive a signal from an output of each coil. Each upconverter has a number of two port upconverter cores, each core having a first port to receive a signal from a local coil and a second port to output an upconverted signal at upper and lower sideband frequencies through an antenna coupled to the second port. The inputs of the plurality of upconverter cores are connected in parallel, and at least one antenna is associated with the second port of each core.

18 Claims, 5 Drawing Sheets

U.S. PATENT DOCUMENTS

| | | |
|---|---|---|
| 2007/0176601 A1 | 8/2007 | Adachi |
| 2007/0188175 A1 | 8/2007 | Burdick, Jr. et al. |
| 2007/0207763 A1 | 9/2007 | Bollenbeck et al. |
| 2008/0157769 A1 | 7/2008 | Renz et al. |
| 2008/0246477 A1 | 10/2008 | Nakabayashi |
| 2009/0079428 A1* | 3/2009 | Nistler et al. ............ 324/311 |
| 2009/0286478 A1 | 11/2009 | Biber et al. |
| 2010/0117650 A1* | 5/2010 | Cork et al. ............ 324/322 |
| 2010/0117651 A1* | 5/2010 | Evans ............ 324/322 |
| 2010/0253346 A1 | 10/2010 | Hulbert |

OTHER PUBLICATIONS

U.S. Appl. No. 12/753,150, filed Apr. 2, 2010.
U.S. Appl. No. 12/753,134, filed Apr. 2, 2010.
U.S. Appl. No. 12/753,148, filed Apr. 2, 2010.
U.S. Appl. No. 12/753,138, filed Apr. 2, 2010.
"Behavioral Modeling and Simulation of a Parametric Power Amplifier," Gray et al., IMS (2009) pp. 1373-1376.

* cited by examiner

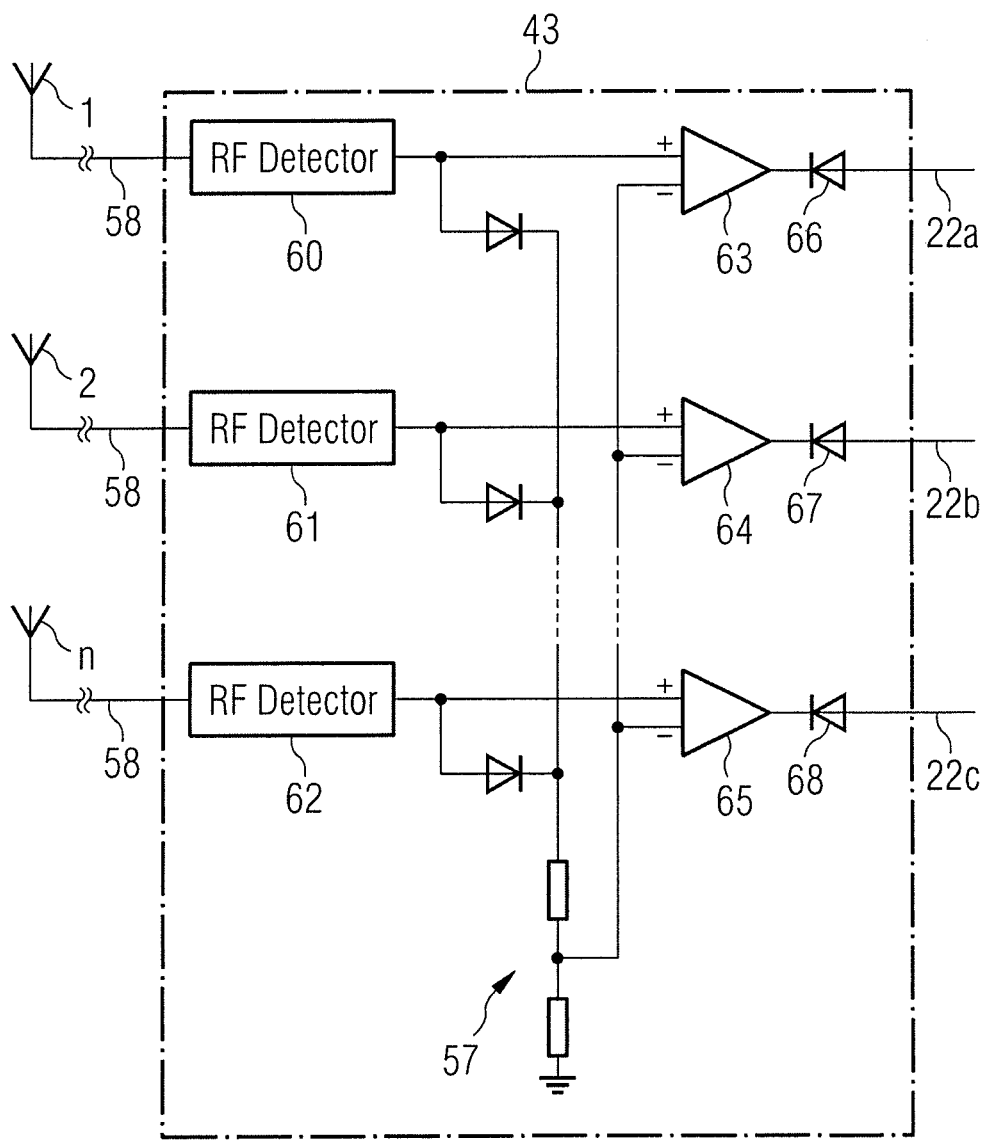

UPCONVERTER

BACKGROUND OF THE INVENTION

1. Field of the Invention

The present invention relates to an upconverter for a wireless magnetic resonance imaging (MRI) scanner, in particular where the orientation of the local coil antenna is unpredictable, or its position cannot be guaranteed to be suitable for reception or transmission.

2. Description of the Prior Art and Related Subject Matter

MRI scanners use a combination of a strong constant magnetic field (B0) from a superconducting magnet which is modified by gradient fields generated by gradient coils, together with a rotating magnetic field (B1) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the B1 field and with the signals generated from the patient so 'traps' (high impedance sections) must be included at regular (typically $\lambda/8$) intervals. These add cost and inconvenience to the structure. In use, the requirement to connect the cables and sterilize them between scanning one patient and the next leads to increased down-time between scans. It is therefore desirable that the cables be eliminated.

Co-pending patent applications 2009P05901GB (GB0905752.2) (corresponding to U.S. application with Attorney Docket No. P10,0068 filed simultaneously herewith) and 2009P05909 GB (GB0905755.5) (corresponding to U.S. application with Attorney Docket No. P10,0070, filed simultaneously herewith) describe a wireless coils implementation that makes use of parametric amplifiers, each connected to one of a number of local coils and each also connected to a microwave antenna, hereinafter referred to as a patient microwave antenna. Co-pending application 2009P05902 GB (GB0905753.0) (corresponding to U.S. application with Attorney Docket No. P10,0069 filed simultaneously herewith) describes an alternative structure based on a two port mixer and low noise amplifier. In addition, whether parametric amplifiers or mixers are used as upconverter cores, the bore of the scanner is lined with microwave antennas, hereinafter referred to as bore microwave antennas, tuned to the same frequency as the other antennas. It is arranged that the bore microwave antennas transmit a local oscillator signal that is received by the patient microwave antennas. This signal provides the necessary power and means to make the parametric amplifiers, mixers and low noise amplifiers operational to upconvert the local signal to the microwave frequencies. The upconverted signals are radiated from the patient microwave antenna and received at the bore microwave antennas. Receivers, connected to one or more of the bore microwave antennas use the same local oscillator to downconvert the signals back to the original frequency. The patient and bore microwave antennas use linear polarization such as may be provided, for example, by the use of dipole or slot antennas.

This concept works well where the local coils are mounted on a mat that is laid across the patient, hereinafter referred to as a patient mat, because the polarization of the patient and bore microwave antennas can readily be aligned. However, in an MRI scanner with wireless coils, using a two port upconverter core, there are two mechanisms which cause a reduction in desired performance. The first is the local oscillator illumination at the patient microwave antenna not being adequate for powering the upconverter core; and the second is that the view of the patient antenna by the bore antenna connected to the receiver is not good enough (e.g. the bore antenna out of range, obscured, or not in the main beam), even if the local oscillator (LO) illumination provides adequate power for the upconverter core.

SUMMARY OF THE INVENTION

In accordance with a first aspect of the present invention a magnetic resonance imaging system upconverter stage has a number of local coils, and a number of upconverters to receive a signal from an output of each coil. Each upconverter has a number of two port upconverter cores, each core having a first port to receive a signal from a local coil and a second port to output an upconverted signal at upper and lower sideband frequencies through an antenna coupled to the second port. The inputs of multiple upconverter cores are connected in parallel; and at least one antenna is associated with the second port of each core.

The present invention provides diversity with more than one path from a local coil to more than one corresponding microwave antenna, so increasing the number of paths from the microwave antenna on the patient to the bore antennas.

In one embodiment, the antennas have co-located cross-dipole antennas.

In another embodiment, the antennas have two or more dipoles, the antennas being distributed at locations remote from one another.

Preferably, the upconverter further has a common power harvester to provide dc power to the upconverter cores.

Preferably, the upconverter further has a power splitter inserted between the second port of each core and its associated antenna.

Preferably, the upconverter further has a control circuit to control operation of each upconverter core.

Preferably, the control circuit has a radio frequency detector, a comparator and a diode for each antenna; and at least one resistive divider for the circuit.

Preferably, the upconverter has two antennas and a resistive divider is provided for each antenna.

In one embodiment the upconverter core has a parametric amplifier. In another, the upconverter core comprises a mixer.

Preferably, the upconverter core further has a low noise amplifier coupled to the first port.

The low noise amplifier output may be unbalanced, or balanced.

The local coil output may be unbalanced, or balanced.

Preferably, the first port is an RF port, receiving signals in the frequency range 20 MHz to 500 MHz.

Preferably, the second port is a microwave port, receiving signals in the frequency range 1 GHz to 5 GHz.

In accordance with a second aspect of the present invention, a wireless magnetic resonance imaging system has a local oscillator and transceiver array mounted on or downstream of a bore of the system; and a wireless local coil array and an upconversion stage according to the first aspect.

BRIEF DESCRIPTION OF THE DRAWINGS

FIG. 7 illustrates a control circuit based on a local oscillator ratio switching threshold for more than twofold diversity.

DESCRIPTION OF THE PREFERRED EMBODIMENTS

Figure 1:
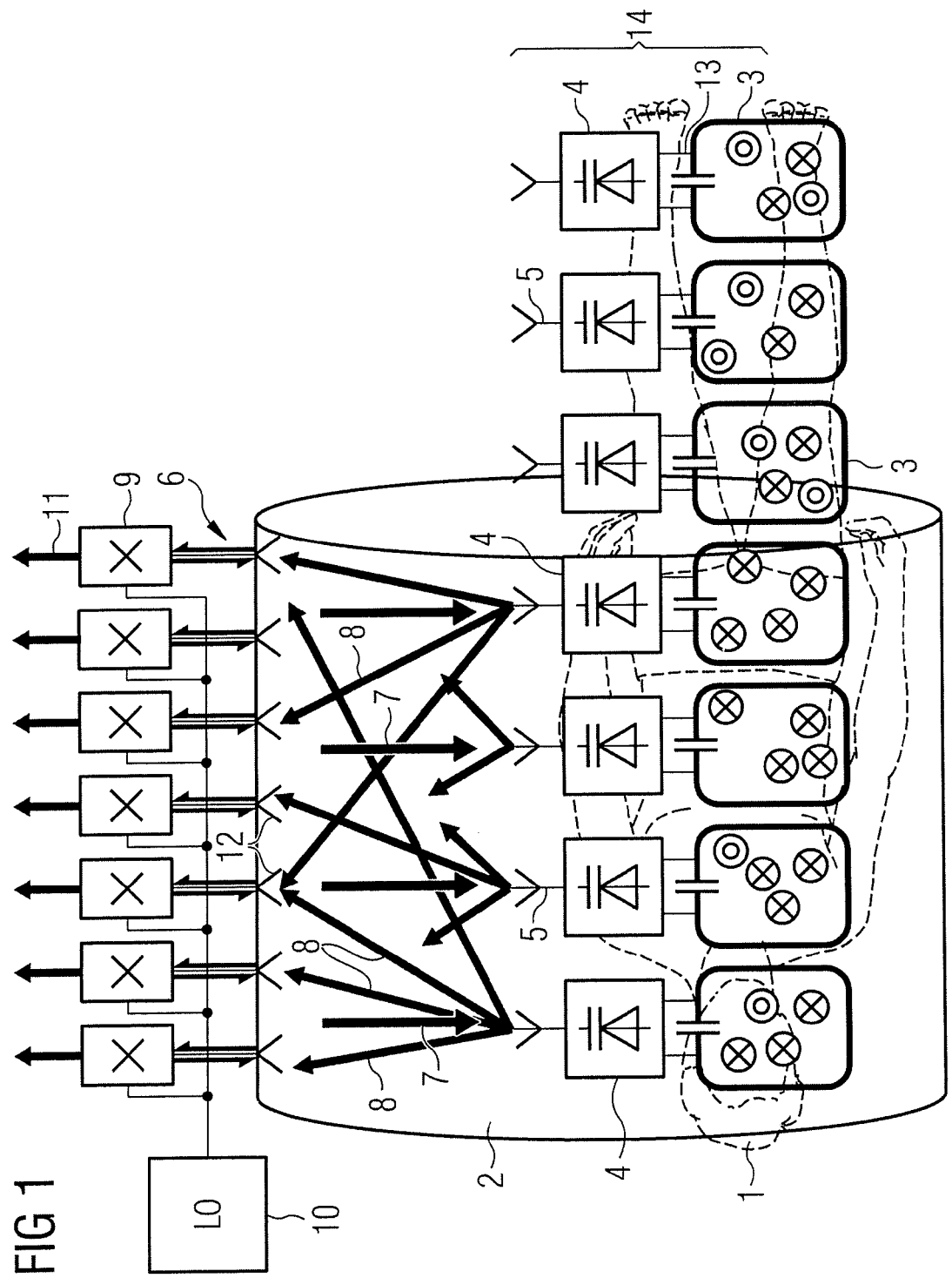
FIG. 1 illustrates a wireless MRI system incorporating a bore tube assembly for use in upconversion of signals from local coils.

An example of an MRI system using a MIMO microwave link is shown in FIG. 1. However, other architectures are possible and the invention is not limited to the one described below. FIG. 1 shows a patient 1 within an MRI scanner bore tube 2. A mat covers the part of the patient to be scanned and embedded in the mat are a plurality of local coils 3. Associated with each local coil 3 is an upconverter 4 and microwave antenna 5. Transceivers 9 connected to an array 6 of antennas 12 are integrated into the scanner bore 2. The frequency upconverter 4 for each patient mat coil 3 produces signals for transmission to the array of transceivers in the scanner bore 2. A signal generator 10 generates a local oscillator (LO) signal at 2.44 GHz, or other chosen microwave frequency, which feeds the transceivers connected to the antenna array 6 to illuminate the patient coil electronics 14 with a signal 7 at the local oscillator frequency.

The same LO signal in the transceivers converts the microwave signals 8, received from the patient coils 3 at the LO frequency±63 MHz, back to the original magnetic resonance (MR) frequency of 63 MHz for input 11 to MR receivers in an image processing system (not shown). The Larmor frequency $\omega 0$ is dependent upon the gyromagnetic ratio $\gamma$ and the magnetic field strength B0, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

Figure 2:
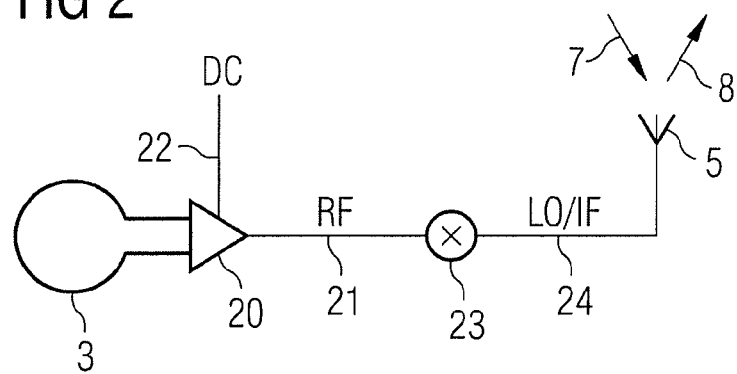
FIG. 2 illustrates an example of an upconverter using a mixer.

In the example of FIG. 1, the local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6. Although the example of FIG. 1 is described with respect to using parametric amplifiers in the upconverters, the circuit can also be implemented using a mixer and low noise amplifier, as illustrated in FIG. 2. In this case, the mixer is the upconverter core and the low noise amplifier is provided between the local coil and a first port of the mixer. Thus, reference to the upconverter core in this application includes either a two port parametric amplifier or a two port mixer.

In the example of FIG. 2, a pick up coil 3 of the local coil array is excited by magnetic resonance signals from the patient 1 at the Larmor frequency and an MR signal 13, so generated, is input to a low noise amplifier (LNA) 20. A DC voltage 22 powers the low noise amplifier. The DC supply to power the amplifier may be provided by a battery or super capacitor that is charged at regular intervals. The input RF signal 13 is amplified and the amplified signal is passed to a first port 21 of a two port mixer 23. A radiated local oscillator (LO) signal 7 from the microwave antennas 12 mounted on the bore tube 2 is received at the microwave antenna 5 connected to a second local oscillator/intermediate frequency port 24 of the mixer. The RF signal 13 and LO signal 7 are mixed in the mixer 23 to produce upper and lower sidebands and provide further amplification as necessary, so that the radio frequency signal 13 received from each of the local coils 3 is upconverted. The upconverted signal including the sidebands is still within the bandwidth of the bore tube microwave antenna 12 and one, other, or both of the sidebands are radiated for reception by receivers 9, which may be in the bore, or downstream of the bore and the receivers process the signals into magnetic resonance images.

The amplified, upconverted signal is output at the same port 24 as received the LO signal, where the LO and IF ports have been combined to a single port. The radio frequency signal and local oscillator signal combine to produce upper and lower sidebands which are still within the bandwidth of microwave antenna 5, then one or both sidebands are re-radiated for reception by the receivers 9, the signals are processed to form magnetic resonance images.

The present invention provides antenna arrangements that allow operation where the patient and bore microwave antenna orientations cannot be guaranteed to be aligned or where the position of the patient microwave antenna cannot be guaranteed to be suitable for reception or transmission. Such a requirement might arise in the situation, for example, where the local coils holder is wrapped around a patient's arm. The holder may be a substantially cylindrical local coil former, or a more flexible structure, such as a patient mat. Depending upon the position in which the patient placed his or her arm, the relative orientation of antenna polarizations could be arbitrary or the patient microwave antenna might be positioned between the arm and the body of the patient, creating significant path attenuation. The antennas can be in separate locations, or the same location, but with diverse polarization, or two pairs of antennas may be provided, both polarised differently.

Figure 3A:
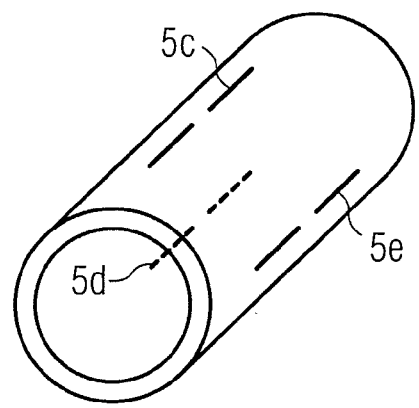
FIG. 3A illustrates dipole diversity in an arm coil.
Figure 3B:
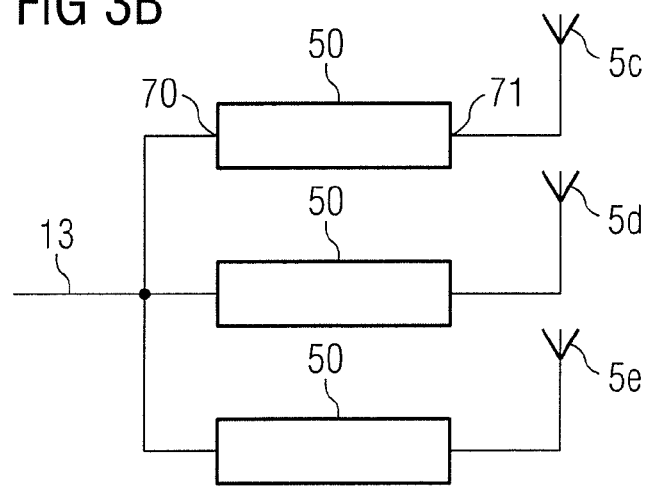
FIG. 3B illustrates connections between the dipole antennas of FIG. 3a and their respective upconverter cores.

An example of such an arrangement is shown in FIG. 3A, where two or more patient microwave dipole antennas 5C, 5D, 5E are mounted at locations that are remote from each other. In the case of the local coil holder wrapped around a patient's arm, the three patient microwave antennas may be mounted at positions separated by 120 degrees around the arm, such that one antenna 5d is behind the arm coil. The antennas 5C, 5D, 5E are connected via a second port 71 to three upconverter cores 50 that share a common input 13 from the local coil to their first ports 70, as illustrated in FIG. 3B Although the coil holder of FIG. 3A is shown as a rigid structure, a suitable sized and shaped patient mat could be wrapped around a limb instead. There would still be the situation that one or more of the patient microwave antennas may be behind the coils and not have a clear path for reception or transmission with a particular bore microwave antenna. A way of addressing the problem is to have multiple patient antennas, associated with a particular local coil, distributed at different locations, so that at least one has a clear path for transmission or reception.

Figure 4A:
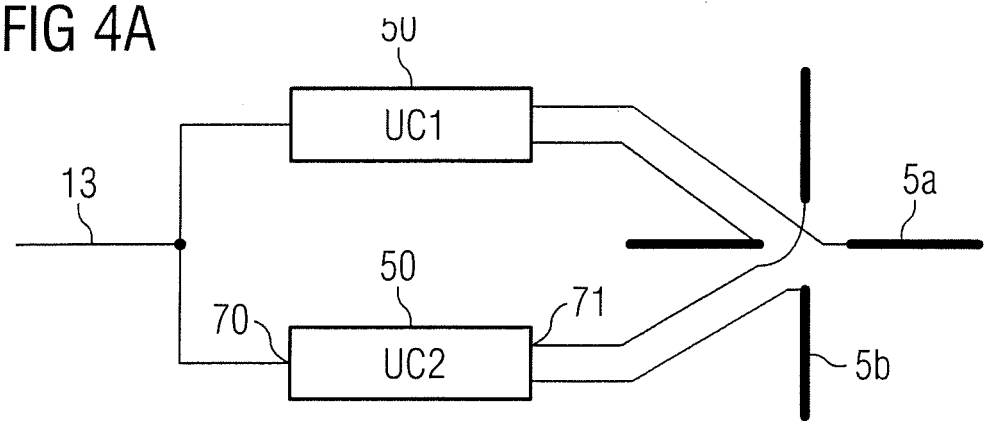
FIG. 4A shows a basic configuration for an upconverter according to the present invention using polarization diversity with an unbalanced output from a local coil.

According to this invention diversity is introduced into the microwave transmission within the bore in such a way as to obviate the problems introduced by the relative positioning of the patient and bore antennas. FIG. 4A illustrates a basic arrangement in which an unbalanced signal output 13 from a local coil 3 is input to the first ports 70 of a pair of two port upconverter cores 50. These may be parametric amplifiers or mixers. Each core is connected via their second ports 71 to a dipole antenna 5A, 5B, which antennas are co-located, with cross-dipoles. The upconverter is suitable for a linearly polarised bore array and the two or more identical upconverter cores are each connected to separate patient microwave antennas. The diversity provided by the arrangement of FIG. 4A achieves independence of orientation by having two patient microwave antennas arranged with their centres coincident, but mutually rotated through 90°. The inputs to the upconverters are connected in parallel to the local coil at a suitable matching point. Other arrangements may be used as described below.

If the linear bore array polarization aligns exactly with the polarization of one of the upconverters, only this one will receive significant local oscillator power and therefore only this one will work effectively. In this case the polarization of the active patient antenna is aligned with the bore array polarization.

Another case is where the polarization of the linearly polarised bore microwave antennas is orientated at 45° with respect to both patient microwave antennas feeding the upconverters. In this case, the upconverters both receive one half of the local oscillator power that they received in the aligned case. Their upconverted signals individually are attenuated by 3 dB because they are 45° away from polar match. However, they add together with in phase, i.e. with 6 dB. The overall effect, under this condition, is that the received signal gain is increased by 3 dB less whatever gain reduction arises from the reduction in received local oscillator power for the two individual upconverters.

Figure 4B:
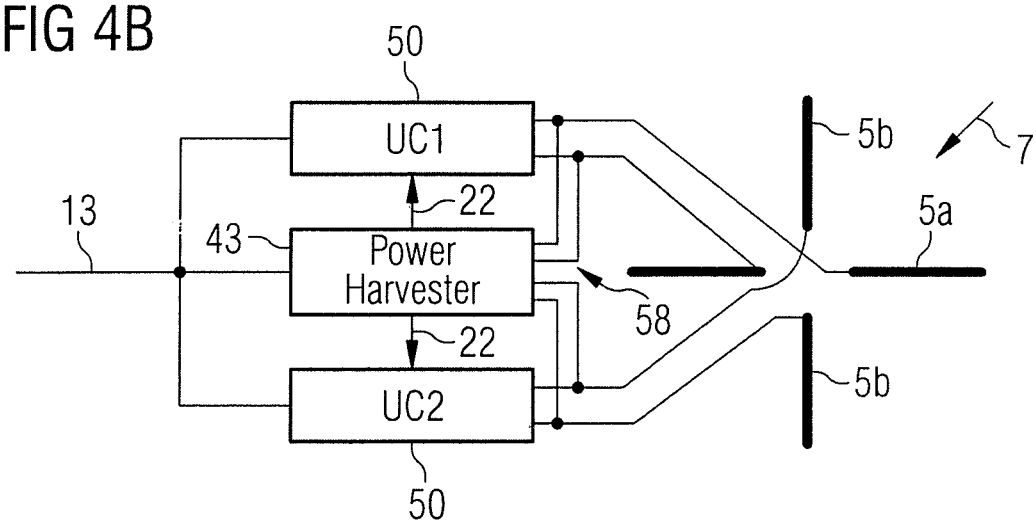
FIG. 4B shows an example of the upconverter of FIG. 4A, with a common power harvester.

A common power harvester may be added to the circuit of FIG. 4A to provide dc bias voltage for the parametric amplifiers. This is illustrated in FIG. 4B. An output 13 from the local coil 3 provides an unbalanced input to the upconverter cores 50. Although, the example of FIG. 4B shows an unbalanced input to the upconverter cores, this may equally be balanced. The power harvester receives power at its input 58, from local oscillator illumination 7, incident on the antennas 5A, 5B. Any parametric amplifier requires dc power to give a bias voltage to the varactor diodes of the parametric amplifier, or to power the mixer, or low noise amplifier if present. The common power harvester of FIG. 4B provides dc voltage 22 to both upconverter cores 50. It is desirable if the dc power is derived from all antennas into a common rectifier, or power harvester, such that the available dc power to all circuits is determined by the best disposed of the microwave antennas with respect to the local oscillator field.

Connection of two parametric amplifier inputs to a local coil increases the loading on that local coil and may adversely affect the noise figure. Given the likely disparity between the parametric amplifier noise input impedance and the conjugate match impedance, the effect is likely to be small. Nevertheless, where possible it is advantageous if the effect can be substantially eliminated. The aforementioned co-pending application GB0905752.2 discloses a hybrid parametric amplifier in which a parametric amplifier core is prefaced with a low noise amplifier (LNA) that is powered by power harvested from the local oscillator. One example of the present invention implements a diversity upconverter in which a common low noise amplifier feeds both parametric amplifiers.

Figure 4C:
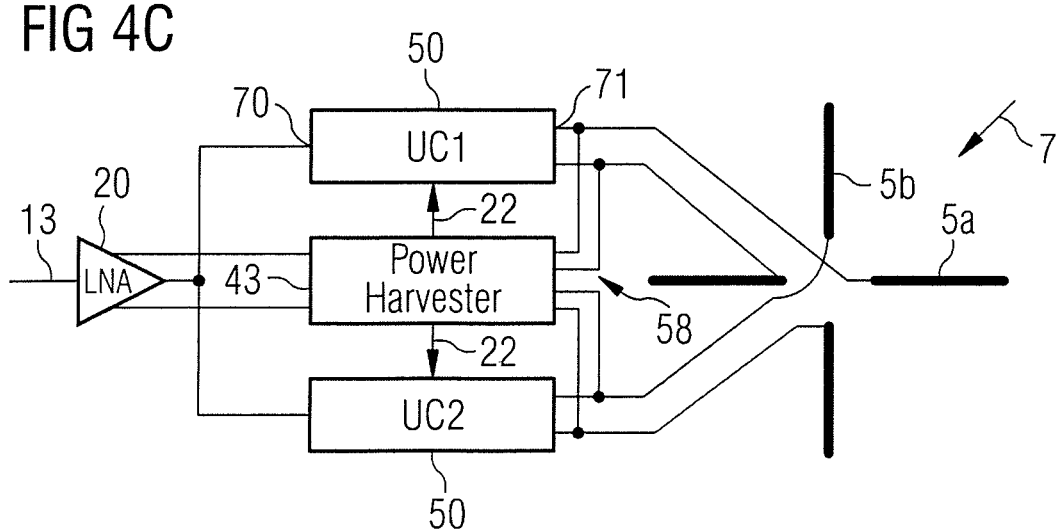
FIG. 4C shows an example of the upconverter of FIG. 4B, with a low noise amplifier.

The single low noise amplifier feeds two or more parametric amplifiers or mixer circuits in parallel from the low noise amplifier output. The noise figure of each feed to the microwave antenna is substantially unaffected by the presence of the other parametric amplifiers or mixers, as the overall noise figure is dominated by the noise figure of the low noise amplifier. An example of this circuit is shown in FIG. 4C. As before, a common power harvester 43 and cross-dipole antennas 5A, 5B are provided in this example. It is advantageous if the output impedance of the LNA 20 is small compared with the input impedance of each of each of the parametric amplifiers 50. In that case, the effect of loading the LNA output with multiple parametric amplifier inputs will be negligible. The output of the parametric amplifiers is balanced and in the example of FIG. 4C, feeds crossed dipole antennas. As with the upconverter cores, the input to the LNA may be balanced or unbalanced and the common power harvester 43 provides dc voltage to the LNA.

In a circuit where power is derived from a power harvester, such as FIGS. 4B and 4C, the power harvester receives 58 RF derived from all antennas. This ensures that regardless of which antenna is more closely aligned with the polarization of the local oscillator field, adequate power can be obtained. The power harvester circuit essentially contains a rectifier and reservoir capacitor with suitable voltage transformation either by impedance transformation of the incident local oscillator signal, a Cockcroft Walton voltage multiplier or a combination of both. The converters from the two sources can be merged at the point of the DC end of the rectifier diodes. In this way the DC is generated according to a "highest wins" rectification of the local oscillator. The output of the LNA is shown connected directly to both parametric amplifier inputs. This can be facilitated by incorporating appropriate input matching circuits for the parametric amplifiers such that the combination of the two parametric amplifiers presents the desired load impedance to the LNA output. The incorporation of an explicit splitter circuit is not precluded.

Figure 5:
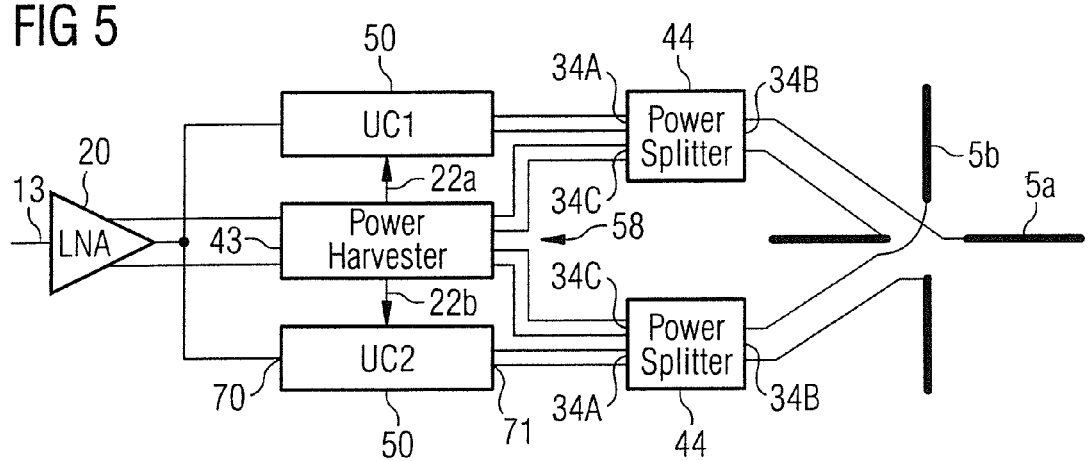
FIG. 5 shows an example of the upconverter of FIG. 4C, with power splitters.

In addition, power splitters to isolate the parametric amplifier core circuit from the power harvester, as disclosed in the aforementioned co-pending patent application GB0905755.5, may also be used in this invention. The configuration in this case is as shown in FIG. 5. The parametric amplifiers 50 in a wireless coils MRI scanner receive their upconversion local oscillator from their connected microwave antenna 5a, 5b which is exposed to a microwave field 7, created by an array of transmitting antennas that line the MRI scanner bore. However, in certain situations, the incident local oscillator is insufficient to produce the required bias voltage and upconverter core may be locked into a stable, non-functional state. This can be dealt with by inserting a power splitter 44, such as a Wilkinson coupler, or directional coupler, between the antenna 5 and the upconverter core 50. A first, lower attenuation, port 34A of the power splitter 44 is connected to the second, microwave, port 34 of the upconverter core 50. A second, higher attenuation, port 34C of the coupler 44 connects to an input 58 of a power harvester 43, otherwise referred to as a rectifier, which generates the necessary DC bias 22a, 22b for each of the upconverter cores UC1, UC2 50. Port 34B connects to the antenna 5. A typical ratio of attenuation is 7 dB, but other ratios are possible according to the relative power requirements of the upconverter core and the power harvester. This type of splitter has the benefit of isolating the changes in impedance with local oscillator strength at the upconverter core interface, from the source impedance of the rectifier 43.

FIG. 5 implies balanced directional couplers. It is possible to use unbalanced directional couplers, but baluns would need to be interposed, as is well understood by those versed in the art.

A problem with the present invention may arise where the orientation or position of the antennas is such that one receives close to 100% of the possible local oscillator power, whereas another receives only a few percent. Under this condition the parametric amplifier connected to the unfavoured antenna may attempt, through its gain compensation circuit, to maintain its gain. However, its gain compression characteristic will be severely compromised. This can create significant distortion in this case. Therefore, a further feature of this invention is that the parametric amplifier receiving the weaker local oscillator is de-activated whenever, either the absolute local oscillator power falls below a threshold, or when the local oscillator power is weaker than some fraction of the local oscillator power received by the favoured parametric amplifier circuit.

Figure 6:
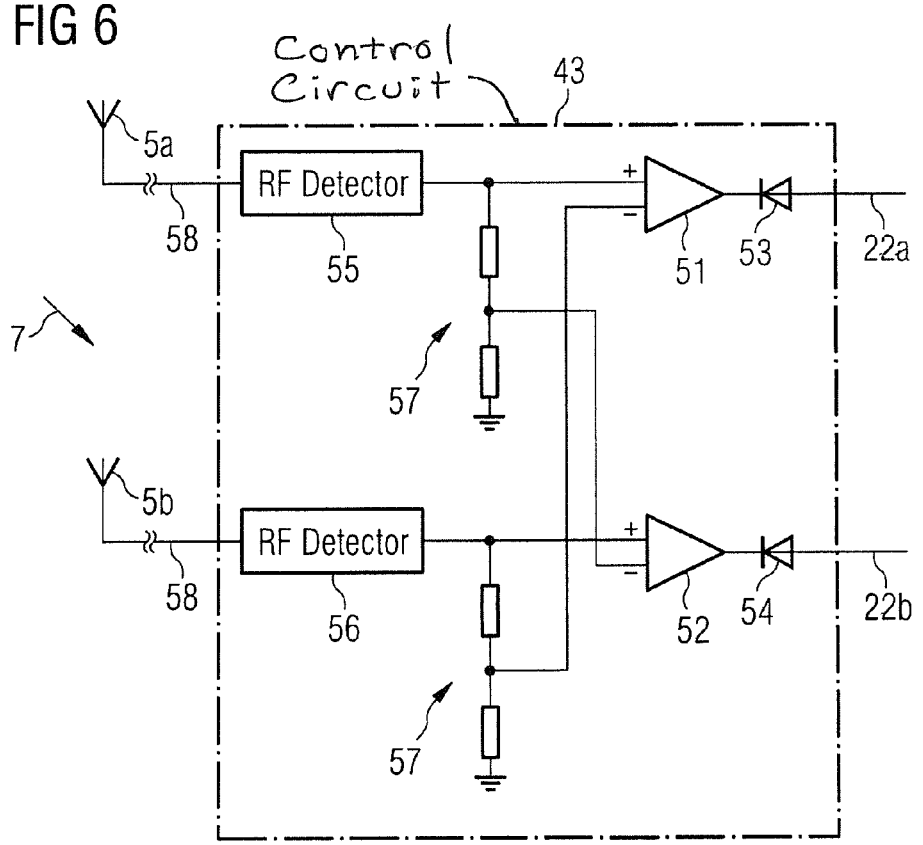
FIG. 6 illustrates a control circuit based on a local oscillator ratio switching threshold for twofold diversity.

A possible control circuit 43 for switching off one of the parametric amplifiers whenever the ratio of local oscillator levels exceeds a threshold, for the case of twofold diversity is illustrated in FIG. 6. The local oscillator illumination 7 received at the patient antennas 5A, 5B is fed to the input 58 of the power harvester 43, directly or via each power splitter 44. If the values of the resistors in the resistive divider 57 are equal, i.e. $R_1=R_2$ and if both dc voltages are the same e.g. 1V, the positive inputs to the comparators 51, 52 are at 1V, the negative inputs are at 0.5V, so the comparator output is positive. This means that the diodes are not pulling down on the bias for the parametric amplifier circuits, so both parametric amplifiers remain active.

In the example where $R_1=R_2$, if the output of RF detector 1=1V and the output of RF detector 2 is 0.4V, then the first comparator 51 has its positive input at 1V and its negative input at 0.2V, so the output to the diode 53 is high and the bias voltage 22a sufficient. However, for the second comparator 52, the positive input is at 0.4V and the negative input is at 0.5V giving an output to the diode 54 which is low and insufficient bias voltage 22b, so the associated parametric amplifier is disabled.

The RF detectors may be connected either to the patient microwave antenna or to a port connected to the power splitter that is connected to that patient microwave antenna. Each RF detector 55, 56 produces a positive DC voltage that is proportional to the local oscillator voltage. The resistive divider 57, consisting of resistors R1 and R2, produces an attenuated voltage. The attenuated voltage from one detector 55 is compared with direct voltage from the other detector 56 and vice versa. For example, if both local oscillator RF voltages are similar, then the unattenuated detected voltage from the top circuit will be greater than the attenuated voltage from the bottom circuit and the output of the top comparator will be high. This will have no impact on the operation of the associated parametric amplifier. On the other hand if the local oscillator voltage into the top circuit is less than R1/(R1+R2) times the local oscillator voltage into the bottom circuit the output of the comparator will be low and the diode will drag the bias voltage on parametric amplifier 1 down, effectively disabling that parametric amplifier circuit. These ratios will not be exact because of the effect of the rectifier diode voltage drops within the RF detectors. However, the circuits can be designed to achieve acceptable variation of threshold ratio over the anticipated range of local oscillator powers. The comparators are powered using power harvested from the local oscillator as illustrated in FIGS. 4B, 4C and 5.

If the number of circuits is higher than two, then an alternative structure is required. One option is illustrated in FIG. 7, which shows the case for threefold diversity or more. Inputs 58 from antennas 1 to n, directly or via a power splitter 44, are fed into RF detectors 1 to n 60, 61, 62. Here the stack of diodes operates as a 'highest wins' circuit. The resistor ratios define a threshold such that only circuits whose received local oscillator power is at least a specified fraction of the power received by the circuit that receives the maximum power will operate.

The negative voltage for each comparator is set by the highest of the RF detectors' output voltages. For the example where $R_1=R_2$, then if the output at RF detector 1 60 and RF detector 2 61 is at 1V, the output at RF detector n 62 is at 0.4V, and the output voltage at the resistive divider 57 is 0.5V, upconverter cores UC1 and UC2 remain on as their comparator 63, 64 outputs to diodes 66, 67 are high and they have sufficient bias voltage 22a, 22b, but UCn is biased off because the output of its comparator 65 to diode 68 is low and the bias voltage 22c is such that it is biased off. The circuit of FIG. 6 is limited to only one upconverter core being biased on and one biased off, but the circuit of FIG. 7 allows any upconverter core with sufficient bias voltage to be on.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance imaging system upconverter stage, comprising:
   a plurality of local coils;
   a plurality of upconverters to receive a signal from an output of each coil;
   each upconverter comprising a plurality of two port upconverter cores, each core having a first port to receive a signal from a local coil and a second port to output an upconverted signal at upper and lower sideband frequencies through an antenna coupled to the second port; and
   the inputs of the plurality of upconverter cores being connected in parallel and at least one antenna being associated with the second port of each core.

2. An upconverter stage according to claim 1, wherein the antennas comprise co-located cross-dipole antennas.

3. An upconverter stage according to claim 1, wherein the antennas comprise two or more dipoles, the antennas being distributed at locations remote from one another.

4. An upconverter stage according to claim 1, wherein the upconverter further comprises a common power harvester to provide dc power to the upconverter cores.

5. An upconverter stage according to claim 1, wherein the upconverter further comprises a power splitter inserted between the second port of each core and its associated antenna.

6. An upconverter stage according to claim 1, wherein the upconverter further comprises a control circuit to control operation of each upconverter core.

7. An upconverter stage according to claim 6, wherein the control circuit comprises a radio frequency detector, a comparator and a diode for each antenna; and at least one resistive divider for the circuit.

8. An upconverter stage according to claim 1, wherein the upconverter comprises two antennas and wherein a resistive divider is provided for each antenna.

9. An upconverter stage according to claim 1, wherein the upconverter core comprises a parametric amplifier.

10. An upconverter stage according to claim 1, wherein the upconverter core comprises a mixer.

11. An upconverter stage according to claim 1, wherein the upconverter core further comprises a low noise amplifier coupled to the first port.

12. An upconverter stage according to claim 11 wherein the low noise amplifier output is unbalanced.

13. An upconverter stage according to claim 1, wherein the local coil output is unbalanced.

14. An upconverter stage according to claim 1, wherein the first port is an RF port.

15. An upconverter stage according to claim 14, wherein the first port receives signals in the frequency range 20 MHz to 500 MHz.

16. An upconverter stage according to claim 1, wherein the second port is a microwave port.

17. An upconverter according to claim 16, wherein the second port receives signals in the frequency range 1 GHz to 5 GHz.

18. A wireless magnetic resonance imaging system, the system comprising:
a magnetic resonance data acquisition unit;
a local oscillator and transceiver array mounted on, or downstream of, the bore of the data acquisition unit;
a wireless local coil array and an upconversion stage comprising a plurality of local coils, a plurality of upconverters to receive a signal from an output of each coil, each upconverter comprising a plurality of two port upconverter cores, each core having a first port to receive a signal from a local coil and a second port to output an upconverted signal at upper and lower sideband frequencies through an antenna coupled to the second port, and the inputs of the plurality of upconverter cores being connected in parallel and at least one antenna being associated with the second port of each core.

* * * * *